(12) United States Patent
Lum-Shue-Chan et al.

(10) Patent No.: US 8,264,200 B2
(45) Date of Patent: Sep. 11, 2012

(54) MULTI-CELL POWER SYSTEM CONTROLLER

(75) Inventors: Brian Lum-Shue-Chan, Palm Bay, FL (US); Karthik Kadirvel, Melbourne, FL (US); John H. Carpenter, Jr., Palm Bay, FL (US); Umar Jameer Lyles, Palm Bay, FL (US)

(73) Assignee: Texas Instruments Incorporated, Dallas, TX (US)

( * ) Notice: Subject to any disclaimer, the term of this patent is extended or adjusted under 35 U.S.C. 154(b) by 541 days.

(21) Appl. No.: 12/466,871

(22) Filed: May 15, 2009

(65) Prior Publication Data

US 2010/0289497 A1 Nov. 18, 2010

(51) Int. Cl.
*H02J 7/00* (2006.01)

(52) U.S. Cl. .................................................. 320/116

(58) Field of Classification Search .......... 320/116–123, 320/134, 136; 324/426, 434; 340/636.1–636.21; 702/63
See application file for complete search history.

(56) References Cited

U.S. PATENT DOCUMENTS

| | | | | | |
|---|---|---|---|---|---|
| 7,609,049 | B1 * | 10/2009 | Tian et al. | ................ | 324/76.11 |
| 7,999,558 | B2 * | 8/2011 | Lyles et al. | ................ | 324/522 |
| 2002/0027469 | A1 * | 3/2002 | Eagar et al. | ................ | 327/539 |
| 2005/0052802 | A1 * | 3/2005 | Wang | ................ | 361/79 |
| 2007/0200632 | A1 * | 8/2007 | Jung et al. | ................ | 330/311 |
| 2010/0194345 | A1 * | 8/2010 | Li | ................ | 320/134 |

OTHER PUBLICATIONS

Horowitz et al., The Art of Electronics, Second Edition, Cambridge University Press, 1989, pp. 88-91.*

* cited by examiner

*Primary Examiner* — Melissa Koval
*Assistant Examiner* — Daniel Miller
(74) *Attorney, Agent, or Firm* — William B. Kempler; Wade J. Brady, III; Frederick J. Telecky, Jr.

(57) ABSTRACT

Various apparatuses and methods for detecting cell connection status of a multi-cell battery are disclosed herein. For example, some embodiments provide an apparatus for detecting cell connection status of a multi-cell battery. The apparatus includes a battery cell input for each cell, a cell connection status detector for each cell, and at least one comparator. Each of the cell connection status detectors is connected to a battery cell input and has a current-based status indicator output. The at least one comparator is connected to the current-based status indicator outputs. Each of the plurality of cell connection status detectors floats in a different supply voltage range. The at least one comparator is referenced to a lower voltage potential than at least one of the plurality of cell connection status detectors.

19 Claims, 6 Drawing Sheets

MULTI-CELL POWER SYSTEM CONTROLLER

BACKGROUND

Batteries used in electronic devices are often made with multiple cells, each having a lower voltage than the entire battery, which are connected in series to provide the desired voltage for the battery. For example, a 12V battery may include ten 1.2V cells stacked in series to add up to the desired output voltage. Because modern batteries have a very high energy density, they present a danger of overheating and explosion if defective or if not used correctly. Devices powered by batteries often include monitoring circuits to protect the device and/or the battery. Various monitoring circuits may detect conditions such as defective batteries generating too much or too little current or voltage, defective electrical connections between a battery and a device, the use of improper battery chargers supplying too much current, etc. Monitoring circuits may be used to warn a user or to turn off the device.

Power supply monitoring circuits designed for a single voltage input or single cell battery are not as effective at protecting devices and batteries when the battery includes multiple cells. For example, two adjacent cells in the battery may short together, creating a potentially hazardous condition, while the overall battery voltage remains substantially unchanged. In this case, a monitoring circuit designed for a single cell battery would monitor only the overall battery voltage and would not immediately detect the hazardous internal short circuit.

The design of monitoring circuits for multi-cell batteries is complicated by the fact that each cell in a stack operates at a different voltage level. For example, in the ten cell 12V battery above, the output of the bottom cell when fully charged is 1.2V, and the output of the ninth cell up the stack is 10.8V. Thus, monitoring circuits must typically be customized for the various voltage levels in a stack of cells in a multi-cell battery.

SUMMARY

Various apparatuses and methods for detecting cell connection status of a multi-cell battery are disclosed herein. For example, some embodiments provide an apparatus for detecting cell connection status of a multi-cell battery. The apparatus includes a battery cell input for each cell, a cell connection status detector for each cell, and at least one comparator. Each of the cell connection status detectors is connected to a battery cell input and has a current-based status indicator output. The at least one comparator is connected to the current-based status indicator outputs. Each of the plurality of cell connection status detectors floats in a different supply voltage range. The at least one comparator is referenced to a lower voltage potential than at least one of the plurality of cell connection status detectors.

In an embodiment of the apparatus, each of the cell connection status detectors comprises a bandgap referenced voltage to current converter connected between a positive terminal and a negative terminal. The positive terminal and negative terminal comprise adjacent battery cell inputs. The at least one comparator is adapted to determine whether a current is on or off in the plurality of current-based status indicator outputs.

In an embodiment of the apparatus, each of the bandgap referenced voltage to current converters includes a voltage divider that is connected between the positive terminal and the negative terminal, a bandgap referenced comparator that is connected to the voltage divider, and a cascoded current source connected to the output of the bandgap referenced comparator. The bandgap referenced comparator is adapted to turn on an output when the voltage divider reaches a bandgap voltage.

In an embodiment of the apparatus, each of the bandgap referenced comparators comprise includes a first diode-connected P-channel transistor connected to the positive terminal, and a first NPN BJT transistor connected to the diode connected P-channel transistor and having a base connected to the voltage divider. The bandgap referenced comparators also include a second P-channel transistor connected to the positive terminal. The gate of the second P-channel transistor is connected to the gate of the first diode-connected P-channel transistor. The bandgap reference comparators also include a second NPN BJT transistor connected to the second P-channel transistor. The base of the second NPN BJT transistor is connected to the base of the first NPN BJT transistor. The emitter of the second NPN BJT transistor is connected to the emitter of the first NPN BJT transistor through a second voltage divider.

In an embodiment of the apparatus, each of the cascoded current sources includes a pair of P-channel transistors, the first having a source connected to the positive terminal and a gate connected to the output of the bandgap referenced comparator, the second with the source connected to the drain of the first P-channel transistor and a gate connected to the base of the first NPN BJT transistor. The second of the pair of P-channel transistors in the cascoded current sources has a higher voltage rating than the first.

In an embodiment of the apparatus, each of the voltage dividers includes three resistors connected in series between the positive terminal and the negative terminal. The first resistor is connected to the positive terminal. The bandgap referenced comparator is connected to a node between the first resistor and the second resistor. Each of the cell connection status detectors includes a resistor switchably connected between the positive terminal and a node between the second and third resistors to change the voltage divider ratio.

In an embodiment of the apparatus, each of the cell connection status detectors is adapted to detect an overvoltage condition at the associated one of the battery cell inputs when the resistors are disconnected from the voltage dividers and to detect an undervoltage condition when the resistors are connected to the voltage dividers.

In an embodiment of the apparatus, each of the cell connection status detectors includes a voltage to current converter connected between a positive terminal and a negative terminal, wherein the positive terminal and negative terminal comprise adjacent battery cell inputs. The at least one comparator is adapted to determine a current magnitude in each of the current-based status indicator outputs.

An embodiment of the apparatus is adapted in a first mode of operation to detect that a battery cell is connected to each of the plurality of battery cell inputs when an associated current-based status indicator output is greater than a first current level. The apparatus is also adapted in a second mode of operation to detect an open condition in each of the battery cell inputs when an associated current-based status indicator output is less than a second current level.

In an embodiment of the apparatus, the at least one comparator includes an adjustable reference current source, and the apparatus is adapted to generate the first current level in the adjustable reference current source in the first mode of operation and to generate the second current level in the adjustable reference current source in the second mode of operation.

In an embodiment of the apparatus, the at least one comparator includes a single bandgap device and a plurality of current mirrors, with a current mirror for each of the current-based status indicator outputs.

In an embodiment of the apparatus, each of the voltage to current converters also includes a first diode connected P-channel transistor connected between the positive terminal and the negative terminal, and a second P-channel transistor connected between the positive terminal and the current-based status indicator output. The gate of the first diode connected P-channel transistor is connected to the gate of the second P-channel transistor.

In an embodiment of the apparatus, each of the voltage to current converters also includes a switch connected in series with the first diode connected P-channel transistor between the positive terminal and the negative terminal.

In an embodiment of the apparatus, each of the voltage to current converters also includes a resistor connected in series with the switch and the first diode connected P-channel transistor between the positive terminal and the negative terminal.

Other embodiments provide a method for detecting cell connection status of a multi-cell battery. The method includes converting a voltage across each cell of the multi-cell battery to a current to generate a current-based connection status indicating signal for each of the cells. The method also includes evaluating a current level of each of the current-based connection status indicating signals. The method also includes generating a common reference status indicating signal for each of the current-based connection status indicating signals based on the current levels. The common reference status indicating signals are referenced to the same voltage level, while each cell of the multi-cell battery is referenced to a different voltage level.

In an embodiment of the method, converting the voltage across each cell to a current includes applying a fraction of the voltage across each cell to a bandgap device, and generating the common reference status indicating signal includes asserting overvoltage indicator signals when current is on in the current-based connection status indicating signals.

In an embodiment of the method, converting the voltage across each cell to a current also includes applying a different fraction of the voltage across each cell to the bandgap device, and generating the common reference status indicating signal also includes asserting undervoltage indicator signals when current is off in the current-based connection status indicating signals.

In an embodiment of the method, generating the common reference status indicating signal includes asserting a cell connected indicator signal when a current level in each of the current-based connection status indicating signals is greater than a reference current level.

In an embodiment of the method, generating the common reference status indicating signal also includes asserting an open circuit indicator signal when a current level in each of the current-based connection status indicating signals is less than a second reference current level.

This summary provides only a general outline of some particular embodiments. Many other objects, features, advantages and other embodiments will become more fully apparent from the following detailed description, the appended claims and the accompanying drawings.

BRIEF DESCRIPTION OF THE DRAWINGS

A further understanding of the various embodiments may be realized by reference to the figures which are described in remaining portions of the specification. In the figures, like reference numerals may be used throughout several drawings to refer to similar components.

DESCRIPTION

The drawings and description, in general, disclose various embodiments of a multi-cell power system controller for detecting cell connection status of a multi-cell battery. For example, the power system controller may be implemented in an integrated circuit that is connected to each cell of a multi-cell battery, monitoring the connections to the cells and performing any other additional functions as desired such as battery charging and voltage or current regulation. The multi-cell power system controller may be used with multi-cell batteries in devices such as power tools, hybrid/plug-in electric vehicles, uninterruptible power supplies (UPS), and other electronic devices, irrespective of the number of cells in the battery.

Embodiments are disclosed that use a bandgap referenced device to detect overvoltage and undervoltage conditions at the cell connections that may be caused by internal shorts in the cells or broken connections to the cells. Embodiments are also disclosed for automatic configuration of a multi-cell power system controller, detecting how many cells are connected to the controller, and for configurable open circuit detection at the cell connections. The various embodiments use current-based status indicator signals, with connection status detectors for each cell floating at the different voltage levels of the stacked cells in a multi-cell battery. The current-based status indicator signals from each cell connection status detector are level shifted and interpreted in a ground-referenced comparator circuit to generate status indicators that may be latched for use by other electronic circuits.

Figure 1:
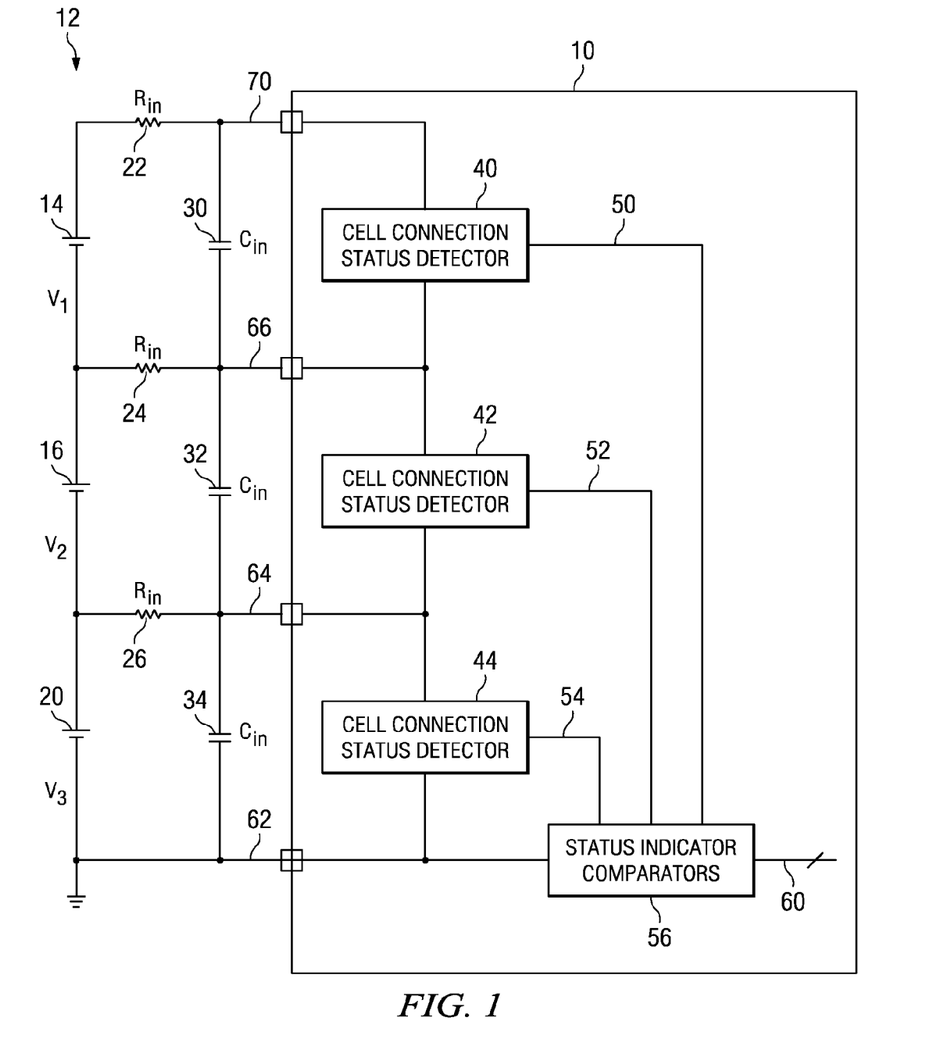
FIG. 1 depicts a multi-cell battery and multi-cell power system controller in accordance with some embodiments.

Turning now to FIG. 1, a multi-cell power system controller 10 is connected to a battery 12 having multiple cells 14, 16 and 20. Each cell 14, 16 and 20 is generally connected to the controller 10 through a resistor 22, 24, and 26, respectively, with a capacitor 30, 32 and 34 connected across each cell to minimize noise. A cell connection status detector 40, 42 and 44 is connected across each cell 14, 16 and 20 in the controller 10. Each cell connection status detector 40, 42 and 44 has a current-based status indicator signal 50, 52 and 54, and a comparator 56 or group of comparators interprets the current-based status indicator signals 50, 52 and 54 to generate common reference status indicator signals 60. Each of the cell connection status detectors 40, 42 and 44 operates across the voltage of its associated cell. Because the cells 14, 16 and 20 are generally connected in series, the voltage level of each cell (e.g., 16) builds on the voltage level of the lower cell (e.g., 20). For example, in a three-cell 3.6V battery, three 1.2V cells 14, 16 and 20 are stacked. At full charge, the bottom input 62 is grounded at 0V relative to other inputs, the input 64 from the bottom cell 20 is at 1.2V, the input 66 from the middle cell 16 is at 2.4V and the input 70 from the top cell 14 is at 3.6V. Because each connection status detector 40, 42 and 44 is connected across one cell 14, 16 and 18, respectively, the total voltage across each connection status detector 40, 42 and 44 is the same. However, each connection status detector 40, 42 and 44 is referenced to a different input 66, 64 and 62, each with a different voltage level. The status of each connection is therefore signaled using current in the current-based status indicator signals 50, 52 and 54, whether the presence or absence of current or the current level. The comparator 56 interprets the currents in the current-based status indicator signals 50, 52 and 54 and generates the common reference status indicator signals 60, which are referenced to the ground at the bottom input 62. The common reference status indicator signals 60 may be latched in the controller 10 for use by other circuits in the controller 10 or elsewhere, such as battery charger circuits, etc.

Figure 2:
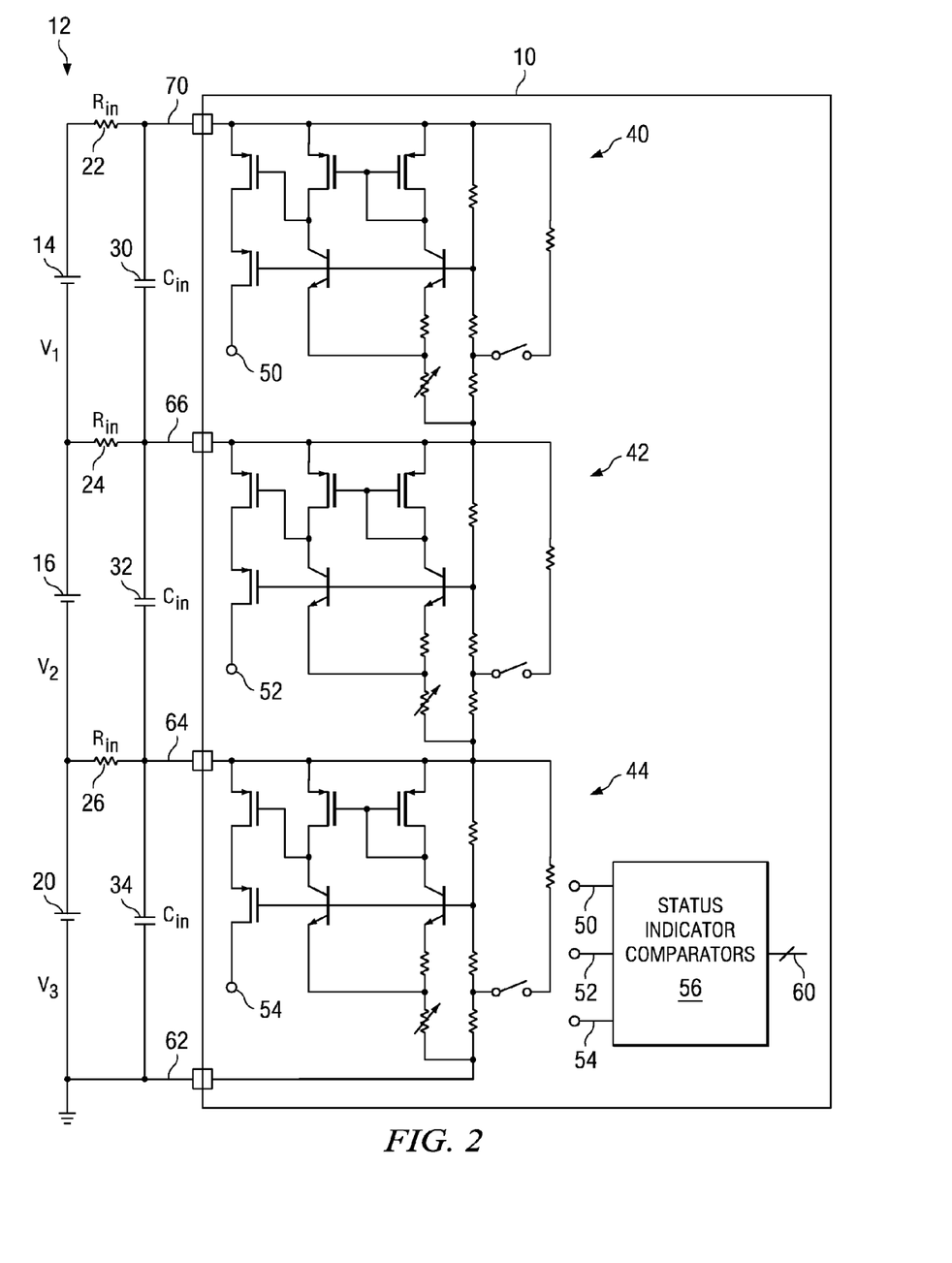
FIG. 2 depicts a multi-cell battery and multi-cell power system controller with bandgap referenced overvoltage and undervoltage detectors in accordance with some embodiments.
Figure 3:
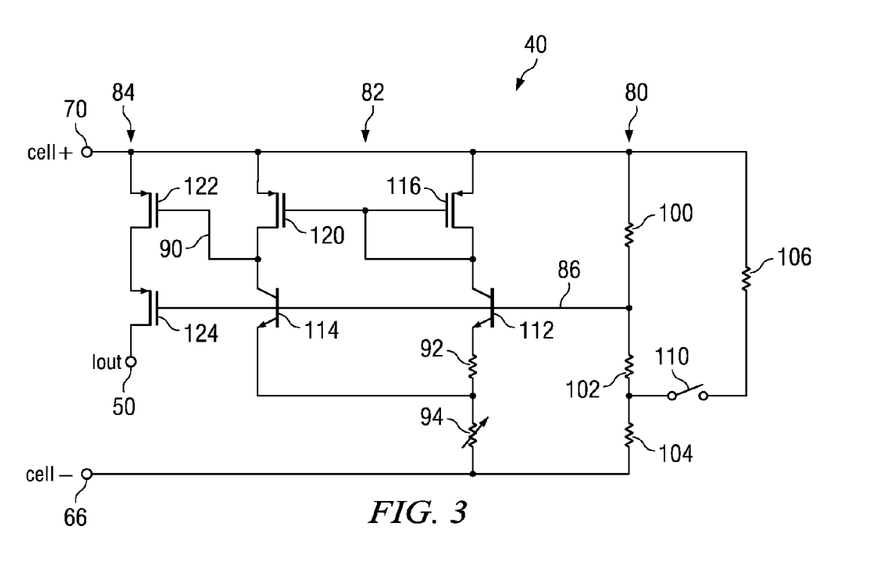
FIG. 3 depicts a bandgap referenced overvoltage and undervoltage detector in accordance with some embodiments.

Turning now to FIGS. 2 and 3, an embodiment of a controller 10 will be described that uses a bandgap referenced device in each cell connection status detector 40 to detect overvoltage and undervoltage conditions at the cell connections. Overvoltage conditions may arise, for example, due to short circuits between cells in a multi-cell battery 12, and undervoltage conditions may arise due to broken connections between the battery terminals and pins of the integrated circuit housing the controller 10. The use of current-based status indicator signals 50, 52 and 54 enables identical cell connection status detectors 40, 42 and 44 to be used, irrespective of the number of cells 14, 16 and 20 in the battery 12 or of the voltage between the inputs (e.g., 70 and 66) to a cell (e.g., 40) and the bottom input 62. In other words, the cell connection status detectors 40, 42 and 44 are fully differential with current outputs enabling them to be operated between cell voltages rather than being ground referenced. The number of cell connection status detectors 40, 42 and 44 in the controller 10 is scalable to any number of cells 14, 16 and 20 because signal processing is done in the current domain. The cell connection status detectors 40, 42 and 44 are bandgap referenced and are stable across temperature, an important feature of a battery monitoring application when battery temperatures may increase. The cell connection status detectors 40, 42 and 44 use relatively little area in an integrated circuit, having only one bandgap device per cell which may be multiplexed for both overvoltage and undervoltage detection. The cell connection status detectors 40, 42 and 44 may be configured to have an extremely low average current consumption, for example less than 1 µA, substantially irrespective of the number of cells in the battery 12.

Because the cell connection status detectors 40, 42 and 44 may be identical, the detailed description will be focused on one of the cell connection status detectors 40 illustrated in FIG. 3. The input 70 from the top cell 14 acts as a positive terminal to the cell connection status detector 40 and the input 66 acts as a negative terminal. The cell connection status detector 40 includes a voltage divider 80 that is connected between the positive terminal 70 and the negative terminal 66. A bandgap referenced comparator 82 is connected to the voltage divider 80, and a cascoded current source 84 is connected to the bandgap referenced comparator. The voltage divider 80 provides a fraction of the voltage between the positive terminal 70 and negative terminal 66 to the input 86 of the bandgap referenced comparator 82. When the voltage at the input 86 reaches the bandgap voltage of the bandgap referenced comparator 82, the output 90 of the bandgap referenced comparator 82 is turned on. Essentially, the bandgap referenced comparator 82 compares the voltage at the input 86 to the bandgap voltage of the bandgap referenced comparator 82. The bandgap referenced comparator 82 turns on the cascoded current source 84 to pull up the current-based status indicator signal 50 and allow current to flow.

The voltage divider 80 may use any suitable devices and configuration to provide a fraction of the voltage between the positive terminal 70 and negative terminal 66 to the input 86 of the bandgap referenced comparator 82. In one embodiment, the voltage divider 80 includes a top resistor 100, a middle resistor 102 and a bottom resistor 104 connected in series between the positive terminal 70 and the negative terminal 66, with a node between the top resistor 100 and the middle resistor 102 connected to the input 86 of the bandgap referenced comparator 82. This divides the voltage across the cell, providing a fraction of the voltage across the cell to the input 86 of the bandgap referenced comparator 82.

The cell connection status detector 40 may be adapted to operate in two modes, one for detecting overvoltage conditions and the other for detecting undervoltage conditions, by varying the ratio of the input voltage applied to the input 86 of the bandgap referenced comparator 82. To accomplish this, the voltage divider 80 may include another resistor 106 connected by a switch 110 to the other resistors 100, 102 and 104, either at the node between the middle resistor 102 and the bottom resistor 104 or at the node between the top resistor 100 and the middle resistor 102, as desired, to switchably change the ratio of the voltage divider 80. The fraction of the voltage between the positive terminal 70 and negative terminal 66 provided to the input 86 of the bandgap referenced comparator 82 may be varied by closing and opening the switch 110.

The specific values of the resistors 100, 102, 104 and 106 in the voltage divider 80 may be selected as desired based on the cell voltage, the voltage trip points selected as an overvoltage or undervoltage condition, the voltage at the input 86 of the bandgap referenced comparator 82 which turns on the output 90, etc.

The bandgap referenced comparator 82 includes a pair of NPN type bipolar junction transistors (BJTS) 112 and 114, a pair of P-channel metal oxide semiconductor (PMOS) transistors 116 and 120 and resistors 92 and 94. The bases of the BJTS 112 and 114 are connected together and form the input 86 of the bandgap referenced comparator 82. The emitter of the BJT 112 is connected to the negative terminal 66 through the series connected resistors 92 and 94. The emitter of the BJT 114 is connected to the emitter of the BJT 112 through the voltage divider formed by the resistors 92 and 94. PMOS transistors 116 and 120 are connected as a current mirror and operate as an active load to the bandgap referenced comparator 82. The sources of the PMOS transistors 116 and 120 are connected to the positive terminal 70. The gate and drain of diode-connected PMOS transistor 116 are connected to the gate of PMOS transistor 120 and to the collector of BJT 112. The drain of the PMOS transistor 120 is connected to the collector BJT 114 and forms the output 90 of the bandgap referenced comparator 82. The BJTS 112 and 114 are sized differently with the BJT 112 having a larger junction area than the BJT 114, and they are operated with the same current level due to the current mirror formed by the PMOS transistors 116 and 120. The BJTS 112 and 114 therefore have different current densities so that temperature dependencies cancel out, ensuring a temperature independent bandgap voltage. In other embodiments, the bandgap referenced comparator 82 may be configured differently or with different components to perform substantially the same function.

The cascoded current source 84 pulls up the current-based status indicator signal 50 to the positive terminal 70 when the output 90 of the bandgap referenced comparator 82 is on, that is, when the input 86 of the bandgap referenced comparator 82 reaches the bandgap voltage. The cascoded current source 84 includes a PMOS transistor 122 with the source connected to the positive terminal 70 and gate connected to the output 90 of the bandgap referenced comparator 82. The cascoded current source 84 also includes a cascoded PMOS transistor 124 with the source connected to the drain of the PMOS transistor 122, the gate connected to the gates of the BJTS 112 and 114, and with the drain forming the current-based status indicator signal 50. In one embodiment, the PMOS transistor 122 in the cascoded current source 84 and the PMOS transistors 116 and 120 in the bandgap referenced comparator 82 are matching transistors of the same species so that the PMOS transistor 122 turns on at the proper voltage level and is not in a sub-threshold conduction state. The cascoded PMOS transistor 124 is a high voltage transistor, acting as a level shifter so that the current-based status indicator signal 50 are ground referenced for the comparator 56.

The comparator 56 (FIG. 2) may include any suitable device for determining whether current is on or off in the current-based status indicator signals 50, 52 and 54. In one embodiment, the comparator 56 includes a current comparator for each of the current-based status indicator signals 50, 52 and 54, with each current comparator comparing the current level in the associated current-based status indicator signals 50, 52 and 54 against a reference current mirrored from an adjustable bandgap-based current source set at a very low current. If the current through the current-based status indicator signals 50, 52 and 54 is above the reference current, the comparator 56 indicates that the current is on.

During operation, the cell connection status detector 40 may be adapted to operate in two modes, one for detecting overvoltage conditions and the other for detecting undervoltage conditions, by varying the ratio of the input voltage applied to the input 86 of the bandgap referenced comparator 82 and reversing the logic of the comparator 56 interpreting the current-based status indicator signal 50. In a first mode, the cell connection status detector 40 detects overvoltage conditions across the cell 14. For example, an overvoltage condition may be defined as 2V across the cell 14 between the positive and negative terminals 70 and 66. If the base to emitter voltage VBE of the BJT 112 is 0.8V, and the voltage drop across the resistors 92 and 94 below the BJT 112 is 0.4V, the bandgap referenced comparator 82 will turn on when the input 86 reaches 1.2V. This may be achieved, for example, by selecting a top resistor 100 having a 4 MΩ resistance and a middle and bottom resistor 102 and 104 having a combined 6 MΩ resistance. This applies a fraction of six tenths of the voltage at the positive terminal 70 to the input 86, so that the input 86 is at 1.2V and will turn on the bandgap referenced comparator 82 when the positive terminal 70 is at 2V. The bandgap referenced comparator 82 and cascoded current source 84 will be cutoff when the positive terminal 70 is below 2V in this case, and the only current flowing will be through the voltage divider 80. The cell connection status detector 40 may therefore be left in the overvoltage detection mode during normal operation without drawing excessive current. An overvoltage condition may occur for a variety of reasons, such as the use of the wrong type of battery charger that applies too high a voltage to the battery 12, or when two adjacent cells are internally shorted in the battery 12, dumping all the voltage of the two cells into one input.

In a second mode, the cell connection status detector 40 detects undervoltage conditions across the cell 14. For example, an undervoltage condition may be defined as having less than 0.8V across the cell 14 between the positive and negative terminals 70 and 66. Thus, the fraction of the voltage at the positive terminal 70 applied to the input 86 is changed by closing the switch 110, and the logic of the comparator 56 interpreting the current-based status indicator signal 50 is inverted so that the common reference status indicator signal 60 is turned on when the voltage at across the cell 14 is less than the undervoltage trip point and the current in the current-based status indicator signal 50 is off. The values of the resistors 100, 102, 104, 106, 92 and 94 in the cell connection status detector 40 are selected so that the bandgap referenced comparator 82 is turned on at the desired overvoltage trip point with the switch 110 open in the overvoltage mode and turned on at the desired undervoltage trip point with the switch 110 closed in the undervoltage mode. In the undervoltage mode, the bandgap referenced comparator 82 is normally on and current is flowing through the current-based status indicator signal 50, until the voltage across the cell 14 falls below the undervoltage threshold. Therefore, although the current in the bandgap referenced comparator 82 and cascoded current source 84 is very small, in one embodiment the switch 110 is closed only briefly to detect undervoltage conditions and to latch the result from the comparator 56. The undervoltage detection may be performed just at startup, or periodically, or continuously as desired. An undervoltage condition may occur because of an open condition or bad connection to a cell 14, or because of a discharged battery 12.

Figure 4:
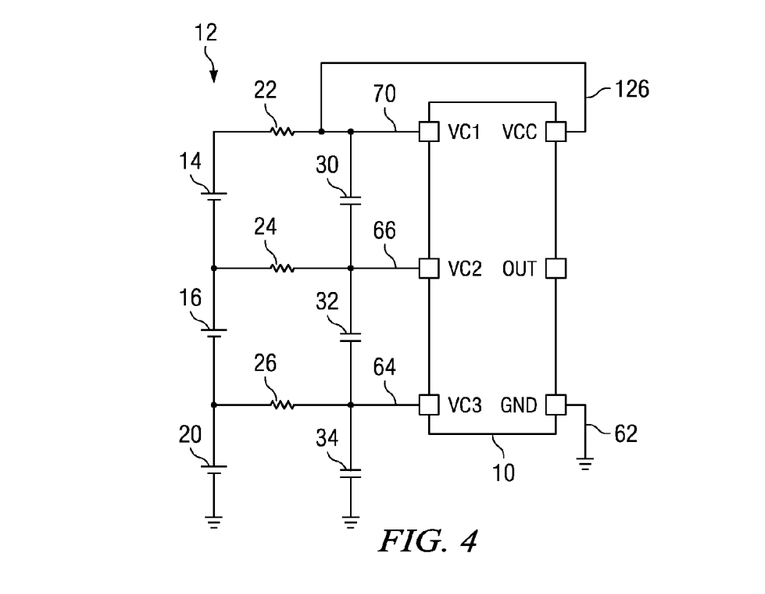
FIG. 4 depicts a three cell battery connected to a three cell power system controller in accordance with some embodiments.
Figure 5:
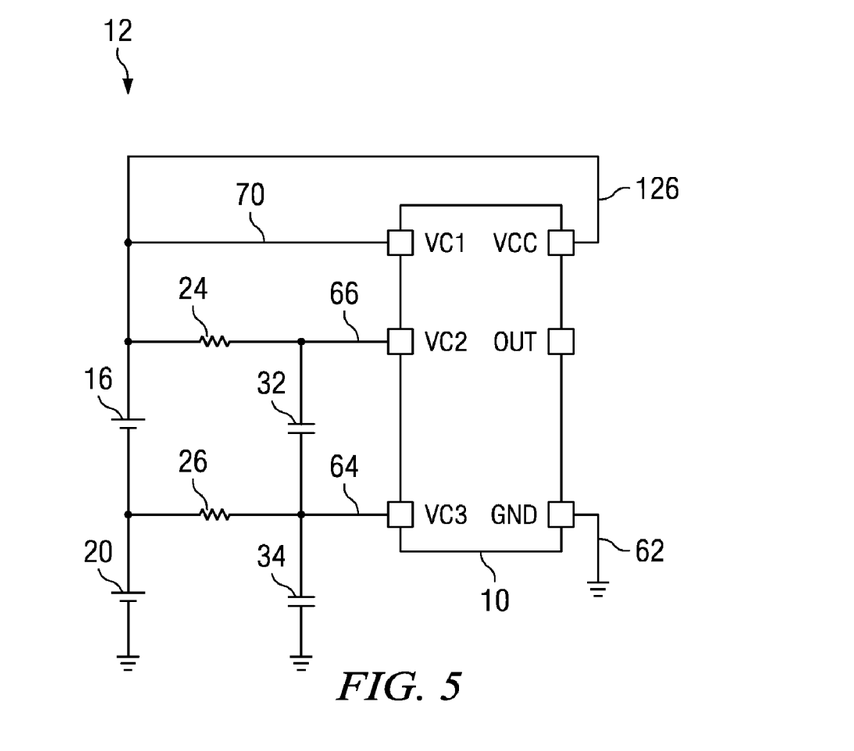
FIG. 5 depicts a two cell battery connected to a three cell power system controller in accordance with some embodiments.

Turning now to FIGS. 4 and 5, another embodiment of the multi-cell power system controller 10 automatically detects the number of cells in a battery 12, allowing the same integrated circuit to be used with various multi-cell batteries without the need to configure the controller 10 with configuration pins or pre-programmed non-volatile memory. A three-cell controller 10 in a three-cell configuration is illustrated in FIG. 4, and a three-cell controller 10 in a two-cell configuration is illustrated in FIG. 5. Unused cell inputs 70 are shorted to $V_{CC}$ 126 at the top potential of the battery 12 as illustrated in FIG. 5, and the controller 10 automatically detects which cell inputs 70 are unused by the battery 12. The controller 10 also provides configurable open circuit detection at the cell inputs (e.g., 70).

Figure 6:
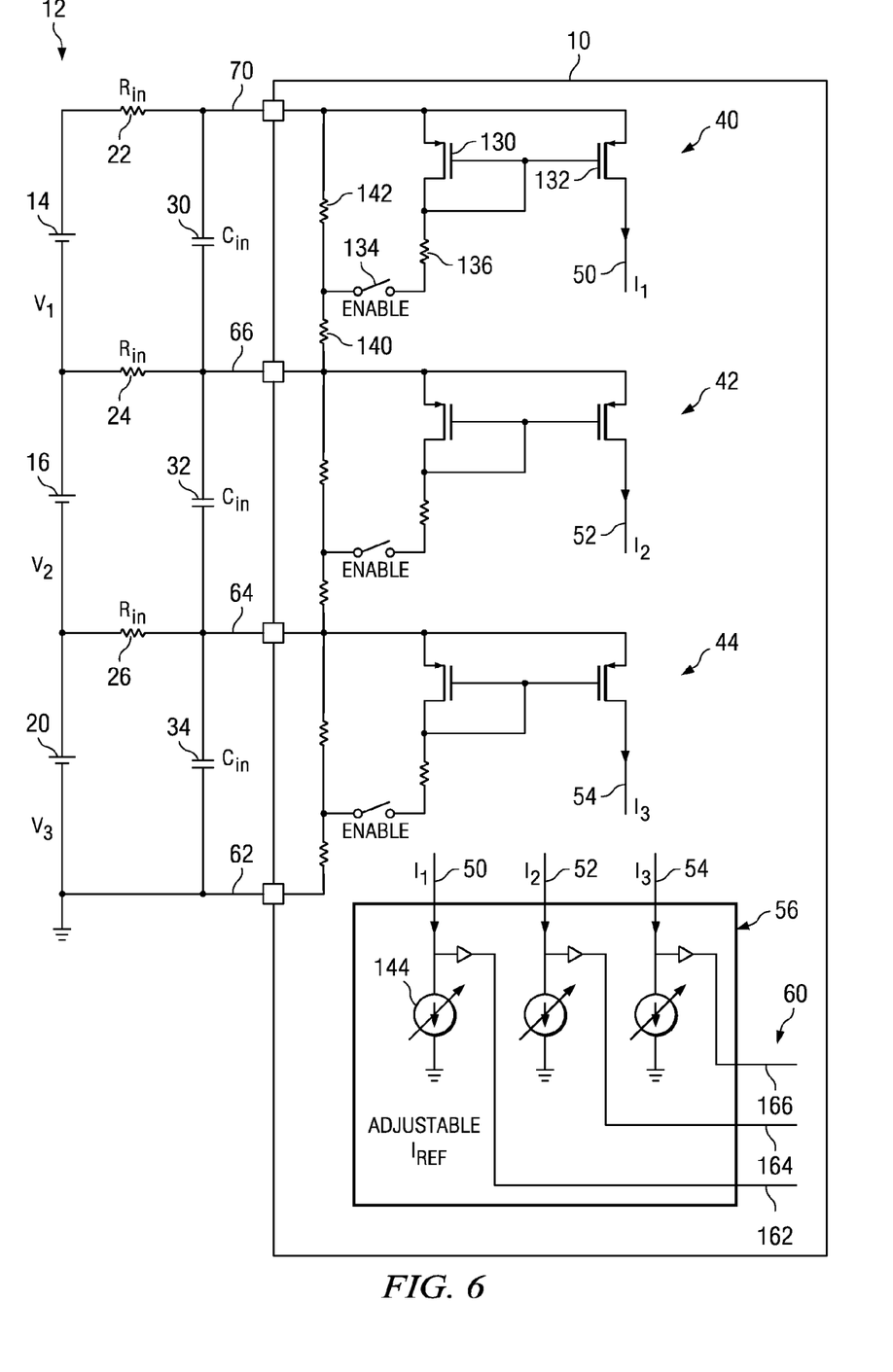
FIG. 6 depicts a multi-cell battery and multi-cell power system controller with automatic cell configuration and open circuit detectors in accordance with some embodiments.

As with previous embodiments, because the cell connection status detectors 40, 42 and 44 may be identical, the detailed description of this embodiment will be focused on one of the cell connection status detectors 40 illustrated in FIG. 6. Again, the input 70 from the top cell 14 acts as a positive terminal to the cell connection status detector 40 and the input 66 acts as a negative terminal. The cell connection status detector 40 has a current mirror formed by a first diode connected PMOS transistor 130 and a second PMOS transistor 132 connected between the positive terminal 70 and the negative terminal 66 and acting as a voltage to current converter. The current through the current-based status indicator signal 50 is proportional to the voltage across the cell 14.

An enable switch 134 may be included in the cell connection status detector 40 in series with the diode connected PMOS transistor 130 to turn off the cell connection status detector 40 and conserve power when not actively configuring the controller 10 or checking for open circuits at the cell inputs (e.g., 70). Resistors 136, 140 and 142 may also be included in series and in parallel with the current mirror in the cell connection status detector 40 to bias the PMOS transistor 130 as desired and to limit current through the cell connection status detector 40.

The current level through the current-based status indicator signal 50 is evaluated by the comparator 56 by comparing it against an adjustable reference current. The reference current may be generated in any suitable manner, such as using a bandgap-based current source (e.g., 144). As with previous embodiments, a single bandgap-based current source 144 may be used in the comparator 56 for all current-based status indicator signals 50, 52 and 54 by mirroring the reference current to comparator devices for each indicator signal. The reference current may be adjusted dynamically by an on-chip digital core in the controller 10 or by an external host to automatically configure the controller 10 and to detect open circuits. The resulting common reference status indicator signals 60 may be latched for use by other devices.

The output current through the current-based status indicator signal 50 may be derived by the expression in equation 1:

$$R_{in} = \frac{V_1 - V_{GSPMOS}}{I_1 M} + R \qquad \text{Equation 1}$$

where $I_1$ is the current through the current-based status indicator signal 50, M is the mirror ratio, $V_{GSPMOS}$ is the gate to source voltage of the diode connected PMOS transistor 130, $R_{in}$ is the resistance of the input resistor 22 and R is the total resistance in series with the diode connected PMOS transistor 130 across the cell 14. Corresponding equations can be developed for the currents through the other current-based status indicator signals 52 and 54. Generally the cell connection status detectors 40, 42 and 44 are configured with equal output current levels, although they may also be configured to generate various output current levels if desired.

A cell 14 is detected as present during automatic configuration of the controller 10 when the current $I_1$ from a cell connection status detector 40 is greater than a reference current $I_{REF1}$ to which the current $I_1$ is compared in the comparator 56. The reference current $I_{REF1}$ in the comparator 56 is set at a level corresponding to a non-zero input resistance, for example about 1 kΩ. This indicates that a voltage is present across the cell 14. If the positive terminal 70 is shorted to $V_{CC}$ 126 as illustrated in FIG. 5, there will be no voltage across the cell between the positive terminal 70 and the negative terminal 66.

The cell connection status detector 40 may also detect an open condition, where the input resistance (e.g., 22) is greater than expected. An open condition is defined herein as any resistance greater than a threshold resistance set to distinguish defective connections from normal operating resistances. This threshold resistance may be set at any level desired. For example, if the input resistors 22, 24 and 26 are intended to be about 1 kΩ, the threshold resistance may be set at about 250 kΩ. If the current $I_1$ through the current-based status indicator signal 50 is less than the reference current Iref1 that corresponds with an input resistance of 250 kΩ, the comparator 56 indicates that an open condition exists at the cell input 70. It may thus be seen that the cell detection and the open detection are impedance level detections with different thresholds. The impedance level detection can be translated to a current level detection. The different thresholds can be adjusted by varying the reference current in the comparator 56. Thus, the same cell connection status detector 40 can be used both for determining the number of cells in the battery 12 and for open circuit detection.

Figure 7:
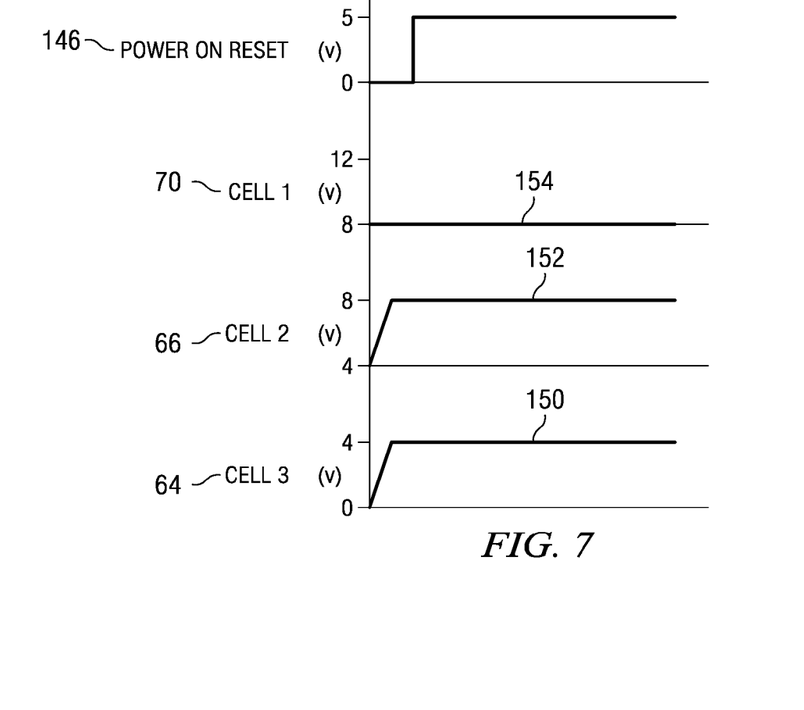
FIG. 7 depicts voltage waveforms including cell voltages in a three cell power system controller with automatic cell configuration when connected to a two cell battery in accordance with some embodiments.
Figure 8:
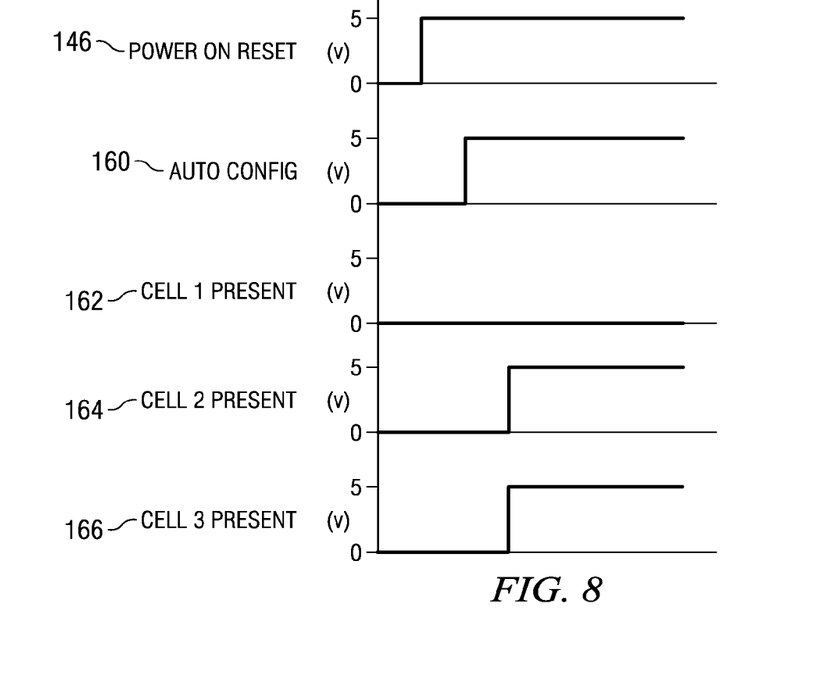
FIG. 8 depicts voltage waveforms including cell configuration output signals in a three cell power system controller with automatic cell configuration when connected to a two cell battery in accordance with some embodiments.

The operation of the controller 10 during automatic configuration is illustrated in FIG. 7 for a battery 12 having two 4V cells 16 and 20 (see FIG. 5). When the controller 10 is first powered up or after a power on reset event 146, the enable switches (e.g., 134) are turned on briefly in the cell connection status detectors 40, 42 and 44. During this period, the current mirrors in the cell connection status detectors 40, 42 and 44 are connected across the cells 14, 16 and 20 to sample the voltage at the cell inputs 70, 66 and 64. Given the battery 12 of FIG. 5 with two cells 16 and 20 connected and with the top cell input 70 shorted, the inputs 64 and 66 will each have a voltage 150 and 152 across them and the top input 70 will indicate that there is no voltage 154 between the third cell input 70 and the second cell input 66. The voltages 150, 152 and 154 are converted to currents in the current-based status indicator signals 50, 52 and 54, which are then interpreted in the comparator 56 with the results stored in a latch as described above. The output of the comparator 56 during the automatic configuration process is illustrated in FIG. 8. When the controller 10 is first powered up or after a power on reset event 146, an automatic configuration signal 160 turns on the enable switches (e.g., 134) in the cell connection status detectors 40, 42 and 44. The automatic configuration signal 160 may be level shifted as appropriate to activate the switches (e.g., 134). After the cell connection status detectors 40, 42 and 44 have generated the currents in the current-based status indicator signals 50, 52 and 54, the comparator 56 generates ground-referenced status indicator signals 60, one 162, 164 and 166 for each of the current-based status indicator signals 50, 52 and 54. In the configuration of FIG. 5, the ground-referenced status indicator signals 164 and 166 are asserted and the ground-referenced status indicator signal 162 is not.

After the number of cells is determined during the automatic configuration, the reference current 144 is adjusted by an internal microprocessor in the controller 10 or by an external host (not shown) to prepare the controller 10 for open circuit detection. During open detection, the same procedure described above is repeated to detect a fault condition and appropriate logic circuitry is used.

The controller 10 does not consume power once the initial determination of the number of connected cells is made unless open detection is periodically performed. Using the information latched from the comparator 56, various parts of the controller 10 performing other functions such as battery charging can be shut down, leading to decreased power consumption in the overall integrated circuit. The average current consumed for open detection is extremely low as it is a sampled data system. By using current mode signal processing, the high voltages applied to the controller 10 by the battery 12 can be processed by low voltage digital circuits. Furthermore, the current in the diode connected PMOS transistors (e.g., 130) flow through the next cell in the stack which reduces overall current consumption.

Figure 9:
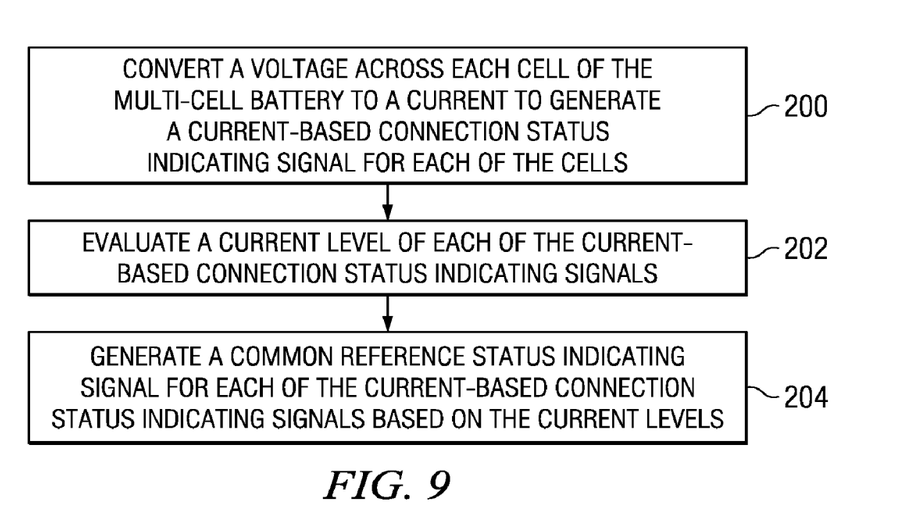
FIG. 9 depicts a flow chart of a method for detecting cell connection status of a multi-cell battery in accordance with some embodiments.

A method for detecting cell connection status of a multi-cell battery is summarized in the flow chart of FIG. 9. The method includes converting a voltage across each cell of the multi-cell battery to a current to generate a current-based connection status indicating signal for each of the cells (block 200), evaluating a current level of each of the current-based connection status indicating signals (block 202), and generating a common reference status indicating signal for each of the current-based connection status indicating signals based on the current levels (block 204). As described above, the common reference status indicating signals are referenced to the same voltage level while each cell of the multi-cell battery is referenced to a different voltage level. The method summarized in the flow chart of FIG. 9 is not limited to any particular order of operation, and various portions of the method may be performed in any suitable order, whether in series, in parallel, or in some combination of the two. Furthermore, the flow chart of FIG. 9 does not imply causal relationships or dependencies between the various portions of the method, but is merely an example and summary of the operation of one embodiment.

While illustrative embodiments have been described in detail herein, it is to be understood that the concepts disclosed herein may be otherwise variously embodied and employed.

What is claimed is:

1. An apparatus for detecting cell connection status of a multi-cell battery, the apparatus comprising:
    a plurality of battery cell inputs;
    a plurality of cell connection status detectors, each connected to a battery cell input, each of the plurality of cell connection status detectors having a current-based status indicator output, wherein each of the plurality of cell connection status detectors comprises a bandgap referenced voltage to current converter generating a discretely-valued current signal having one of an on value and an off value, the bandgap referenced voltage to current converter connected between a positive terminal and a negative terminal, which comprise adjacent ones of the plurality of battery cell inputs; and
    at least one comparator connected to the plurality of current-based status indicator outputs, wherein each of the plurality of cell connection status detectors floats in a different supply voltage range, and wherein the at least one comparator is referenced to a lower voltage potential than at least one of the plurality of cell connection status detectors.

2. The apparatus of claim 1, wherein the at least one comparator is adapted to determine whether a current is on or off in the plurality of current-based status indicator outputs.

3. The apparatus of claim 2, wherein each of the plurality of bandgap referenced voltage to current converters comprises:
    a voltage divider that is connected between the positive terminal and the negative terminal;
    a bandgap referenced comparator that is connected to the voltage divider, wherein the bandgap referenced comparator is adapted to turn on an output of the bandgap referenced comparator when the voltage divider reaches a bandgap voltage; and
    a cascoded current source connected to an output of the bandgap referenced comparator.

4. The apparatus of claim 3, wherein each of the bandgap referenced comparators comprise:
    a first diode-connected P-channel transistor connected to the positive terminal;
    a first NPN BJT transistor connected to the diode connected P-channel transistor, the first NPN BJT transistor having a base connected to the voltage divider;
    a second P-channel transistor connected to the positive terminal, wherein a gate of the second P-channel transistor is connected to a gate of the first diode-connected P-channel transistor; and
    a second NPN BJT transistor connected to the second P-channel transistor, wherein a base of the second NPN BJT transistor is connected to the base of the first NPN BJT transistor, and wherein an emitter of the second NPN BJT transistor is connected to an emitter of the first NPN BJT transistor through a second voltage divider.

5. The apparatus of claim 4, wherein each of the cascoded current sources comprise:
    a third P-channel transistor having a source connected to the positive terminal and a gate connected to the output of the bandgap referenced comparator; and
    a fourth P-channel transistor having a source connected to a drain of the third P-channel transistor and a gate connected to the base of the first NPN BJT transistor, wherein the fourth P-channel transistor has a higher voltage rating than the third P-channel transistor.

6. The apparatus of claim 3, wherein each of the voltage dividers comprise a first resistor, a second resistor and a third resistor connected in series between the positive terminal and the negative terminal, wherein the first resistor is connected to the positive terminal and the bandgap referenced comparator is connected to a node between the first resistor and the second resistor, wherein each of the plurality of cell connection status detectors further comprises a fourth resistor switchably connected between the positive terminal and a node between the second resistor and the third resistor.

7. The apparatus of claim 6, wherein each of the plurality of cell connection status detectors is adapted to detect an overvoltage condition at the associated one of the battery cell inputs when the fourth resistors are disconnected from the voltage dividers and to detect an undervoltage condition when the fourth resistors are connected to the voltage dividers.

8. The apparatus of claim 1, wherein the apparatus is adapted to detect that a battery cell is connected to each of the plurality of battery cell inputs when an associated one of the current-based status indicator outputs is greater than a first current level in a first mode of operation and to detect an open condition in each of the plurality of battery cell inputs when an associated one of the current-based status indicator outputs is less than a second current level in a second mode of operation.

9. The apparatus of claim 8, wherein the at least one comparator comprises an adjustable reference current source, and wherein the apparatus is adapted to generate the first current level in the adjustable reference current source in the first mode of operation and to generate the second current level in the adjustable reference current source in the second mode of operation.

10. The apparatus of claim 9, wherein the at least one comparator comprises a single bandgap device and a plurality of current mirrors, one current mirror for each of the plurality of current-based status indicator outputs.

11. The apparatus of claim 1, wherein each of the voltage to current converters further comprises:
    a first diode connected P-channel transistor connected between the positive terminal and the negative terminal; and
    a second P-channel transistor connected between the positive terminal and the current-based status indicator output, wherein a gate of the first diode connected P-channel transistor is connected to a gate of the second P-channel transistor.

12. The apparatus of claim 11, wherein each of the voltage to current converters further comprises a switch connected in series with the first diode connected P-channel transistor between the positive terminal and the negative terminal.

13. The apparatus of claim 12, wherein each of the voltage to current converters further comprises a resistor connected in series with the switch and the first diode connected P-channel transistor between the positive terminal and the negative terminal.

14. A method for detecting cell connection status of a multi-cell battery, the method comprising:
 converting a voltage across each cell of the multi-cell battery to a current to generate a current-based connection status indicating signal for each of the cells;
 evaluating a current level of each of the current-based connection status indicating signals from a cell connection status detector comprising a bandgap referenced voltage to current converter generating a discreetly-valued current signal having one of an on value and an off value; and
 generating a common reference status indicating signal for each of the current-based connection status indicating signals based on the current levels, wherein the common reference status indicating signals are referenced to a same voltage level and wherein each cell of the multi-cell battery is referenced to a different voltage level.

15. The method of claim 14, wherein converting the voltage across each cell to a current comprises applying a fraction of the voltage across each cell to a bandgap device, and wherein generating the common reference status indicating signal comprises asserting overvoltage indicator signals when current is on in the current-based connection status indicating signals.

16. The method of claim 15, wherein converting the voltage across each cell to a current further comprises applying a different fraction of the voltage across each cell to the bandgap device, and wherein generating the common reference status indicating signal further comprises asserting undervoltage indicator signals when current is off in the current-based connection status indicating signals.

17. The method of claim 14, wherein generating the common reference status indicating signal comprises asserting a cell connected indicator signal when a current level each of the current-based connection status indicating signals is greater than a reference current level.

18. The method of claim 17, wherein generating the common reference status indicating signal further comprises asserting an open circuit indicator signal when a current level each of the current-based connection status indicating signals is less than a second reference current level.

19. An apparatus for detecting cell connection status of a multi-cell battery, the apparatus comprising:
 a plurality of battery cell inputs;
 a plurality of cell connection status detectors, each connected to a battery cell input, each of the plurality of cell connection status detectors having a current-based status indicator output, wherein each of the plurality of cell connection status detectors comprises a bandgap referenced voltage to current converter generating a discretely-valued current signal having one of an on value and an off value, the bandgap referenced voltage to current converter connected between a positive terminal and a negative terminal, which comprise adjacent ones of the plurality of battery cell inputs; and
 at least one comparator connected to the plurality of current-based status indicator outputs, wherein each of the plurality of cell connection status detectors floats in a different supply voltage range, and wherein the at least one comparator is referenced to a lower voltage potential than at least one of the plurality of cell connection status detectors, wherein each of the plurality of cell connection status detectors comprises:
 a switchable voltage divider connected across the cell, the switchable voltage divider being adapted to switch between a first resistance and a second resistance at an output of the switchable voltage divider, wherein each of the plurality of cell connection status detectors is adapted to detect an overvoltage condition at the associated one of the battery cell inputs when the switchable voltage divider is switched to the first resistance and to detect an undervoltage condition when the switchable voltage divider is switched to the second resistance;
 a first diode-connected P-channel transistor connected to the positive terminal;
 a first NPN BJT transistor connected to the diode connected P-channel transistor, the first NPN BJT transistor having a base connected to the voltage divider;
 a second P-channel transistor connected to the positive terminal, wherein a gate of the second P-channel transistor is connected to a gate of the first diode-connected P-channel transistor; and
 a second NPN BJT transistor connected to the second P-channel transistor, wherein a base of the second NPN BJT transistor is connected to the base of the first NPN BJT transistor, and wherein an emitter of the second NPN BJT transistor is connected to an emitter of the first NPN BJT transistor through a second voltage divider.

\* \* \* \* \*